United States Patent
Chauvet et al.

(10) Patent No.: US 10,958,264 B2
(45) Date of Patent: Mar. 23, 2021

(54) CIRCUIT SYSTEM FOR CONTROLLING AN ELECTRICAL CONSUMER

(71) Applicant: Robert Bosch GmbH, Stuttgart (DE)

(72) Inventors: Yannick Chauvet, Stuttgart (DE); Federico Ignacio Sanchez Pinzon, Kornwestheim (DE); Johannes Zondler, Stuttgart (DE); Michael Wilhelm Haas, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 143 days.

(21) Appl. No.: 16/325,620

(22) PCT Filed: Jul. 31, 2017

(86) PCT No.: PCT/EP2017/069260
§ 371 (c)(1),
(2) Date: Feb. 14, 2019

(87) PCT Pub. No.: WO2018/033374
PCT Pub. Date: Feb. 22, 2018

(65) Prior Publication Data
US 2019/0190509 A1 Jun. 20, 2019

(30) Foreign Application Priority Data
Aug. 17, 2016 (DE) .......................... 102016215324.2

(51) Int. Cl.
*H03K 17/082* (2006.01)
*H03K 17/28* (2006.01)
(Continued)

(52) U.S. Cl.
CPC .............. *H03K 17/082* (2013.01); *G06F 1/08* (2013.01); *G06F 1/10* (2013.01); *H03K 5/00006* (2013.01); *H03K 17/28* (2013.01); *H03K 21/02* (2013.01)

(58) Field of Classification Search
CPC .. H03K 5/00006; H03K 17/078; H03K 17/28; H03K 21/02
See application file for complete search history.

(56) References Cited

U.S. PATENT DOCUMENTS 6,600,641 B2* 7/2003 Oglesbee ................ G05F 1/565
361/103

FOREIGN PATENT DOCUMENTS

GB 2244183 A 11/1991
WO 01/45226 A1 6/2001

OTHER PUBLICATIONS

International Search Report for PCT/EP2017/069260, dated October 27, 2017.

* cited by examiner

*Primary Examiner* — Patrick O Neill
(74) *Attorney, Agent, or Firm* — Norton Rose Fulbright US LLP; Gerard Messina

(57) ABSTRACT

A circuit system for controlling an electrical consumer, the circuit system including an up-down counter, and the circuit system being configured to generate a control signal for controlling the electrical consumer, in particular for shutting off the electrical consumer, as a function of a counter content of the up-down counter. The circuit system includes a controllable clock divider circuit, with the aid of which the circuit system is configured to predefine a counting direction and a counting speed of the up-down counter as a function of at least one variable characterizing an actual current and/or a nominal current of the electrical consumer.

15 Claims, 2 Drawing Sheets

(51) Int. Cl.
*G06F 1/08* (2006.01)
*G06F 1/10* (2006.01)
*H03K 5/00* (2006.01)
*H03K 21/02* (2006.01)

CIRCUIT SYSTEM FOR CONTROLLING AN ELECTRICAL CONSUMER

FIELD OF THE INVENTION

The present invention relates to a circuit system and to a method for the circuit system.

BACKGROUND INFORMATION

Electronic circuits which are able to activate an electrical consumer and ascertain a power consumption or a current consumption of the electrical consumer in the process are known from the market. As a function of predefinable criteria, the electrical consumer may be activated in such a way that thermal overloading of the electrical consumer is avoided.

SUMMARY OF THE INVENTION

An object underlying the present invention may be achieved by a circuit system and by a method as described herein. Advantageous refinements are specified in the further descriptions herein. Features which are important for the present invention may also be found in the following description and in the drawings, the features being important for the present invention either alone or also in various combinations, without making explicit reference thereto again.

The present invention relates to a circuit system for controlling an electrical consumer, the circuit system including an up-down counter, and the circuit system being configured to generate a control signal for controlling the electrical consumer, in particular for shutting off the electrical consumer, as a function of a counter content of the up-down counter. The circuit system includes a controllable clock divider circuit, with the aid of which the circuit system is configured to predefine a counting direction and a counting speed of the up-down counter as a function of at least one variable characterizing an actual current and/or a nominal current of the electrical consumer.

An up-down counter is characterized by a digital counter circuit which is able to selectively count in a forward ("up") or reverse ("down") direction as a function of at least one clock signal, a counter content of the up-down counter being accordingly increased or decreased. At the same time, this characterizes a "counting direction" of the up-down counter. In one embodiment, the up-down counter is configured to be activated with the aid of a first and a second clock signal. If the first clock signal is active, the counter counts up, and if the second clock signal is active, the counter counts down. If none of the clock signals are active, the counter does not count, maintaining its counter content. Said control signal for controlling the electrical consumer may be generated when the counter content of the up-down counter has reached or exceeded a predefinable overflow threshold.

A counting speed ("counting rate") of the up-down counter is defined by a change in the counter content over time, which is generally characterized by a binary number. In one embodiment, the counter content is changed by a value "one" with every clock step. Accordingly, the counting speed may be predefined by the selection of a clock frequency and/or by the selection of a division factor characterizing the clock divider circuit.

In one further embodiment, the circuit system includes a control logic which is configured to operate the up-down counter as a function of the at least one variable characterizing the actual current and/or the nominal current of the electrical consumer in such a way that a counter content of the up-down counter is variable with a respective clock step by a positive or negative number greater than or equal to zero, whereby the counting direction and the counting speed of the up-down counter are predefinable. In this way, an increment or a decrement of the up-down counter may be dynamically varied. This embodiment has the advantage that a switchable clock divider is possibly dispensable.

The electrical consumer may be an arbitrary electrically operable device, for example a solenoid coil, an electric motor or the like. For example, the electrical consumer may be switched with the aid of a semiconductor switch, in particular with the aid of a metal oxide semiconductor field effect transistor (MOSFET). The circuit system may be configured to consider or reproduce the thermal behavior of the electrical consumer and/or of the semiconductor switch. In one embodiment, the circuit system is configured to consider or reproduce, in particular, the thermal behavior of the "weaker" or "more critical" element, for example of the MOSFET.

The actual current of the electrical consumer may be ascertained, for example, with the aid of a comparatively low-resistance ohmic resistor, which is connected in an electric feed line of the electrical consumer. A potential or a voltage may be detected on the resistor proportionally to the actual current. The potential or the voltage is the variable characterizing the actual current.

The nominal current is known, for example, from a data sheet of the electrical consumer or of the semiconductor switch. The circuit system may be configured to predefine the counting direction and the counting speed of the up-down counter as a function of at least one variable characterizing the actual current and the nominal current of the electrical consumer. Advantageously, a difference may be formed as a function of the actual current and the nominal current, the up-down counter counting up if the difference is positive, and the up-down counter counting down if the difference is negative. If the difference drops below a predefinable absolute value, the up-down counter may be stopped, the counter content being maintained. Said difference may be formed virtually, for example, with the aid of the configuration of the clock divider circuit, and thus does not necessarily require an explicit subtraction of two currents or voltages.

In one embodiment, the circuit system may be configured to predefine the counting direction and the counting speed of the up-down counter as a function of at least one variable characterizing the actual current of the electrical consumer. This embodiment thus takes place without use or knowledge of the nominal current.

Overall, the circuit system at least approximately carries out a (thermal) monitoring of the electrical consumer and/or of a semiconductor switch controlling the electrical consumer according to the so-called "$I^2t$ principle". A square of the actual current ("$I^2$") characterizes a power consumed by the electrical consumer. Accordingly, the product of the square of the actual current with the time ("$I^2t$") characterizes an energy consumed by the electrical consumer, in particular lost energy. The up-down counter, in particular, enables an integral to be formed of said product "$I^2t$" of the actual current or an integral to be formed of a difference of the products "$I^2t$" of the actual current and the nominal current. The integral formation carried out with the aid of the circuit system so-to-speak reproduces a thermal behavior of the electrical consumer or of the semiconductor switch.

In one embodiment, the circuit system is configured as an integrated semiconductor switch or contained as part of an integrated semiconductor switch. For example, the integrated semiconductor switch is an application-specific integrated circuit (ASIC), a field programmable gate array (FPGA), a microcontroller or the like.

The present invention has the advantage that an electrical consumer may be operated briefly with a higher electrical power than the nominal power. This relates to, for example, a start-up of the electrical consumer or what may be a brief load peak during operation. A possible thermal overload of the electrical consumer or of the semiconductor switch controlling the electrical consumer may be avoided.

In particular, thanks to the controllable clock divider circuit, the circuit system may advantageously be implemented using particularly simple digital switching elements. In particular, it is not necessary to explicitly square the variable characterizing the actual current, as is described in greater detail below.

In one further embodiment, the circuit system is configured to predefine at least one division factor of the controllable clock divider circuit as a function of the at least one variable characterizing the actual current and/or the nominal current of the electrical consumer. In this way, the counting speed ("counting rate") of the up-down counter may be predefined particularly easily and cost-effectively as a function of the actual current and/or the nominal current.

In one further embodiment, the division factor is incrementally variable by a respective factor of 2. In this way, a particularly simple specific embodiment is advantageously made possible for the controllable clock divider circuit. In addition or as an alternative, it may be provided that the division factor is optionally variable by a respective factor of 2 or 4 or 8 or 16 or 32 or 64. The latter alternative may be advantageous, for example, when in one embodiment the clock divider circuit only includes one clock divider, with the aid of which the up-down counter may be clocked for both counting directions.

In one further embodiment, the controllable clock divider circuit includes a first and a second controllable clock divider, the first controllable clock divider being configured to clock the up-down counter for counting up, and the second controllable clock divider being configured to clock the up-down counter for counting down. In this way, a control of the clock divider circuit may take place particularly easily, and a counting speed of the up-down counter may be varied particularly flexibly.

In one embodiment, the clock divider circuit includes (only) one first clock divider, the first clock divider being configured to clock the up-down counter at a clock input, and the up-down counter including at least one control input for a counting direction of the up-down counter, and the up-down counter being configured to count up or down, or to maintain a counter content, as a function of the at least one control input. In this way, a complexity may possibly be reduced and cost may be lowered. For example, the counter content may be maintained by blocking the one clock input of the up-down counter with the aid of a digital gate.

In one further embodiment, the circuit system is configured to compare the variable characterizing the actual current of the electrical consumer with a threshold value and to vary the threshold value as a function of the comparison, and in particular also as a function of the threshold value itself. The comparison to the threshold value and the change in the threshold value dependent thereon advantageously enables a comparatively simple analog-to-digital conversion which is nonetheless very useful for the present purpose. In this way, complexity and costs may be saved.

In one further embodiment of the circuit system, the variable characterizing the actual current of the electrical consumer is a first potential, the first potential being connected to a first input of a comparator, and a second input of the comparator being connected to a second potential, and the circuit system being configured to vary the second potential as a function of the second potential itself and as a function of an output signal of the comparator. In this way, an advantageous option for the above-described analog-to-digital conversion is provided. In one embodiment, the above-described threshold value corresponds to the second potential or a voltage comparable thereto.

In one further embodiment, the circuit system is configured to predefine the threshold value with the aid of selection from a multitude of reference threshold values of differing levels, the circuit system furthermore being configured to select a reference threshold value which is greater in relation to an instantaneous reference threshold value when the variable characterizing the actual current of the electrical consumer is greater than the threshold value, and to select a reference threshold value which is smaller in relation to an instantaneous reference threshold value when the variable characterizing the actual current of the electrical consumer is smaller than the threshold value. This advantageously makes it possible for the threshold value to follow a progression of the variable over time comparatively quickly, and nonetheless with useful accuracy. With the aid of knowledge of at least the two reference threshold values used most recently, an instantaneous value range for the variable characterizing the actual current of the electrical consumer may be ascertained.

In one further embodiment, at least some, which may be however all, reference threshold values of differing levels are continuously different from one another at least approximately by a respective factor of approximately $\sqrt{2}$. In one embodiment, this factor has a value between approximately 1.3 and approximately 1.6. In one further embodiment, this factor has a value between approximately 1.2 and approximately 1.7. In still one further embodiment, this factor has a value between approximately 1.1 and approximately 1.9. The above-described analog-to-digital conversion thus may take place in a non-linear fashion. Together with the above-described property that the division factor is incrementally variable by a respective factor of 2, a squaring necessary for the above-described "$I^2t$ principle" results "automatically" so-to-speak for the variable characterizing the actual current. In this way, the circuit system may advantageously be implemented using particularly simple digital switching elements.

In one further embodiment, the circuit system is configured to predefine at least one division factor of the controllable clock divider circuit as a function of a digital variable characterizing the threshold value. In this way, the counting speed of the up-down counter may advantageously be predefined with the aid of the division factor. Expressed in more general terms, the circuit system is configured to predefine the division factor of the controllable clock divider circuit (or of a first and/or a second clock divider(s) of the clock divider circuit) as a function of the at least one variable characterizing an actual current and/or a nominal current of the electrical consumer.

In one embodiment, the circuit system is configured to shut off the electrical consumer (immediately) when the threshold value has reached a predefinable maximum reference threshold value. In this way, the electrical consumer and/or a semiconductor switch controlling the electrical consumer may additionally advantageously be monitored in relation to a potential overcurrent and be protected.

Moreover, the present invention relates to a method for operating a circuit system for controlling an electrical consumer, the circuit system including an up-down counter, and the circuit system generating a control signal for controlling the electrical consumer, in particular for shutting off the electrical consumer, as a function of a counter content of the up-down counter. The circuit system includes a controllable clock divider circuit, with the aid of which the circuit system predefines a counting direction and a counting speed of the up-down counter as a function of at least one variable characterizing an actual current and/or a nominal current of the electrical consumer. In one embodiment, the variable characterizing the actual current is a potential or a voltage.

In one embodiment of the method, the controllable clock divider circuit includes a first and a second controllable clock divider, the method including at least one of the following steps:

the first controllable clock divider clocks the up-down counter for counting up;
the second controllable clock divider clocks the up-down counter for counting down;
the circuit system predefines a division factor of the first and/or the second controllable clock divider(s) as a function of the at least one variable characterizing the actual current and/or the nominal current of the electrical consumer, in particular the division factor being incrementally variable by a respective factor of 2.

In one further embodiment of the method, the variable characterizing the actual current of the electrical consumer is compared to a threshold value, the threshold value being varied as a function of the comparison, and in particular also as a function of the threshold value itself. In one embodiment, the threshold value is a potential or a voltage.

In one further embodiment of the method, the threshold value is predefined with the aid of selection from a multitude of reference threshold values of differing levels, a reference threshold value which is greater in relation to an instantaneous reference threshold value being selected when the variable characterizing the actual current of the electrical consumer is greater than the threshold value, and a reference threshold value which is smaller in relation to an instantaneous reference threshold value being selected when the variable characterizing the actual current of the electrical consumer is smaller than the threshold value.

In one embodiment of the method, the variable characterizing the actual current of the electrical consumer is a first potential, the first potential being connected to a first input of a comparator, and a second input of the comparator being connected to a second potential, and the second potential being predefined as a function of the second potential itself and an output signal of the comparator.

In one further embodiment of the method, the second potential is predefined with the aid of selection from a multitude of reference potentials of differing levels, a reference potential which is greater in relation to an instantaneous reference potential being selected when the first potential is greater than the second potential, and a reference potential which is smaller in relation to an instantaneous reference potential being selected when the first potential is smaller than the second potential.

In one further embodiment of the method, a digital variable is ascertained as a function of the threshold value or the second potential, and at least one division factor of the controllable clock divider circuit (or of a first and a second clock divider of the clock divider circuit) is predefined as a function of the digital variable.

In one further embodiment of the method, the digital variable is ascertained with the aid of an analog-to-digital converter. In this way, the comparator and a digital logic cooperating with the comparator may be entirely or partially replaced.

In one further embodiment of the method, the following steps are carried out cyclically:
(a) comparing the variable characterizing the actual current of the electrical consumer to the threshold value;
(b) selecting a reference threshold value which is greater in relation to an instantaneous reference threshold value if the comparison yields a first result;
(c) selecting a reference threshold value which is smaller in relation to an instantaneous reference threshold value if the comparison yields a second result;
(d) transmitting a digital variable characterizing the threshold value to a control circuit controlling the controllable clock divider circuit;
(e) varying a counting direction and/or a counting speed of the up-down counter as a function of the digital variable; and
(f) returning to step (a) of the method.

It shall be understood that the method is carried out at least partially with finite delay times to prevent an uncontrolled oscillation of the threshold value or of the second potential.

Comparable advantages as were already described above for the circuit system according to the present invention result for the described method and its embodiments.

Exemplary specific embodiments of the present invention are described hereafter with reference to the drawings.

Functionally equivalent elements and variables in all figures are denoted by identical reference numerals, even in different specific embodiments.

DETAILED DESCRIPTION

Figure 1:
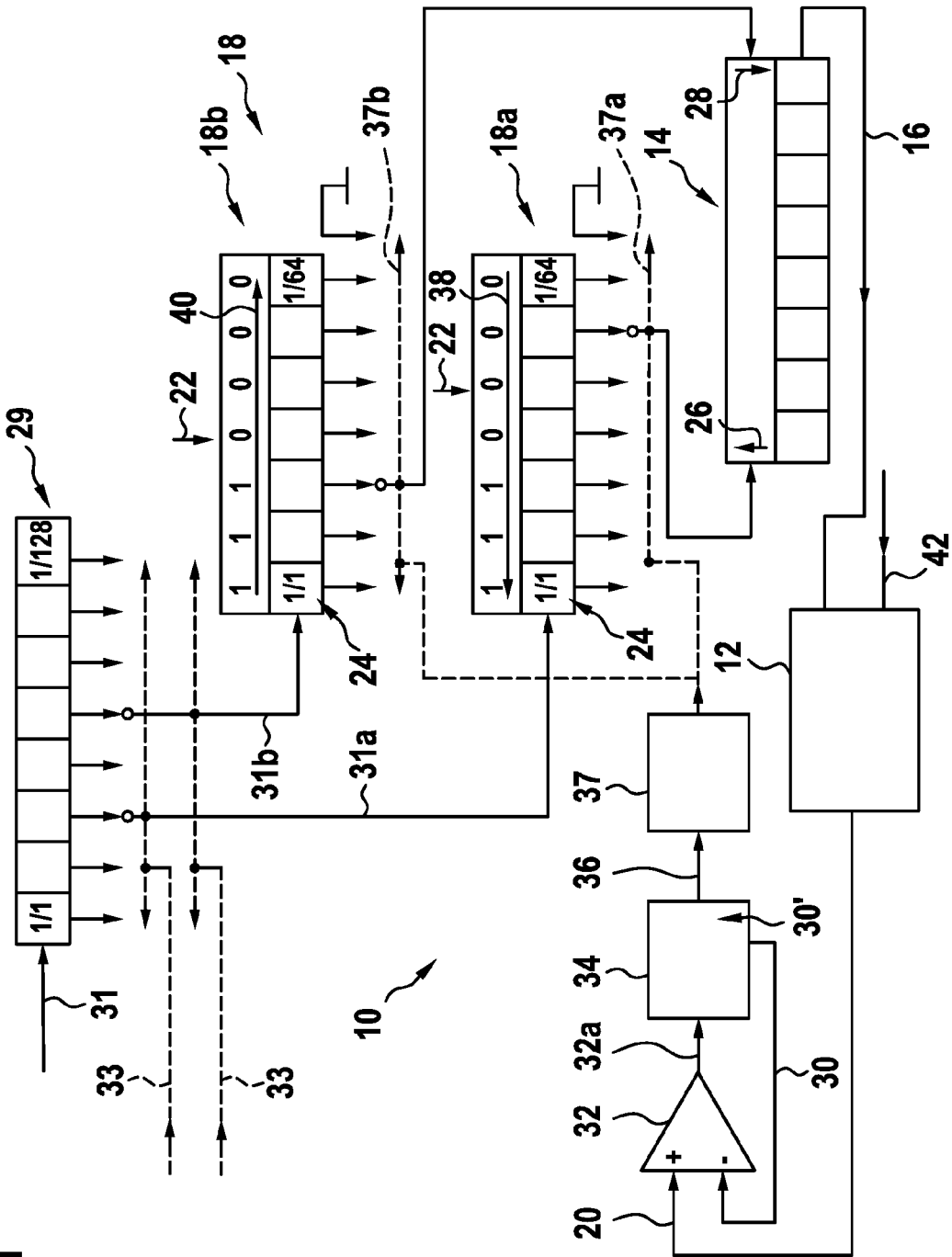
FIG. 1 shows one specific embodiment for a circuit system for controlling an electrical consumer.

FIG. 1 shows a circuit system 10 for controlling an electrical consumer 12, circuit system 10 including an up-down counter 14, and circuit system 10 being configured to generate a control signal 16 for controlling electrical consumer 12, in particular for shutting off electrical consumer 12, as a function of a counter content of up-down counter 14. The block shown in FIG. 1 with reference numeral 12 may include a semiconductor switch controlling electrical consumer 12 and a low-resistance measuring resistor for the actual current connected in series thereto.

Furthermore, circuit system 10 includes a controllable clock divider circuit 18, with the aid of which circuit system 10 is configured to predefine a counting direction and a counting speed of up-down counter 14 as a function of at least one variable 20 or 22 characterizing an actual current and/or a nominal current of electrical consumer 12.

Circuit system 10 is configured to predefine at least one division factor 24 of controllable clock divider circuit 18 as a function of the at least one variable 20 or 22 characterizing the actual current and/or the nominal current of electrical consumer 12. In the specific embodiment of FIG. 1, division factor 24 is incrementally variable by a respective factor 2, and in particular in the present example from a factor 1/1 to a factor 1/64.

In circuit system 10 of FIG. 1, controllable clock divider circuit 18 includes a first and a second controllable clock divider 18a and 18b, first controllable clock divider 18a being configured to clock up-down counter 14 for counting up, and second controllable clock divider 18b being configured to clock up-down counter 14 for counting down. A symbolic arrow 26 denotes a clock input of up-down counter 14 for counting up, and a symbolic arrow 28 denotes a clock input of up-down counter 14 for counting down.

Furthermore, circuit system 10 includes an (optional) prescaler 29, which is shown in an upper area in FIG. 1. In the present example, prescaler 29 has eight divider stages, which enable a configurable prescaling of a clock input signal 31 in stages of 1/1, 1/2, 1/4 to 1/128. Clock input signal 31 thus prescaled is used as clock signal 31a for first clock divider 18a and as clock signal 31b for second clock divider 18b. A clock frequency of clock signals 31a and 31b may be predefined or configured with the aid of prescaler 29. In one embodiment, a configuration of circuit system 10 takes place with the aid of a so-called "Microsecond Bus" (MSC bus).

Horizontal dotted lines 33 beneath prescaler 29 indicate that the clock division enabled by prescaler 29 is configurable. In the present example, different clock frequencies may be predefined for clock signal 31a and for clock signal 31b. With the aid of this configuration, the mode of operation of circuit system 10 may be adapted particularly well to the operation of clock dividers 18a and 18b or particularly well to the properties of electrical consumer 12.

In the specific embodiment of FIG. 1, circuit system 10 is configured to compare variable 20 characterizing the actual current of electrical consumer 12 to a threshold value 30 and to vary threshold value 30 as a function of the comparison, and in particular also as a function of threshold value 30 itself.

In the present example, circuit system 10 is configured to predefine threshold value 30 with the aid of selection from a multitude of reference threshold values 30' of differing levels, circuit system 10 furthermore being configured to select a reference threshold value 30' which is greater in relation to an instantaneous reference threshold value 30' when variable 20 characterizing the actual current of electrical consumer 12 is greater than threshold value 30, and to select a reference threshold value 30' which is smaller in relation to an instantaneous reference threshold value 30' when variable 20 characterizing the actual current of electrical consumer 12 is smaller than threshold value 30.

For this purpose, circuit system 10 of FIG. 1 includes a comparator 32 and a logic 34, to which an output signal 32a of comparator 32 is supplied. Variable 20 characterizing the actual current is supplied to a non-inverting input of comparator 32, and threshold value 30 is supplied to an inverting input of comparator 32. Variable 20 and threshold value 30 each correspond to an electrical potential or a voltage.

At least some, which may be however all, reference threshold values 30' of differing levels are continuously different from one another at least approximately by a respective factor of approximately $\sqrt{2}$. For example, variable 20 characterizing the actual current and reference threshold values 30' are each characterized by a voltage. For example, reference threshold values 30' continuously have values of 10 mV (millivolt)/15 mV/20 mV/30 mV/40 mV/60 mV/80 mV/110 mV. For example, actual currents of electrical consumer 12 of 1 A (ampere)/1.5 A/2 A/3 A/4 A/6 A/8 A/11 A are characterized thereby.

Circuit system 10 of FIG. 1 is configured to predefine at least one division factor 24 of controllable clock divider circuit 18 as a function of a digital variable 36 characterizing threshold value 30. This takes place with the aid of a control circuit 37.

For first clock divider 18a, an arrow 38 denotes reference threshold values 30' assigned to the respective division factors 1/64 through 1/1 in ascending order from right to left in the drawing. In the present example, these have seven values 15 mV/20 mV/30 mV/40 mV/60 mV/80 mV/110 mV. An eighth reference threshold value 30' having value 10 mV is characterized in the drawing to the right of first clock divider 18a by an arrow and a ground symbol (each without reference numeral).

For second clock divider 18b, an arrow 40 denotes reference threshold values 30' assigned to the respective division factors 1/1 through 1/64 in ascending order from left to right in the drawing. In the present example, these have seven values 10 mV/15 mV/20 mV/30 mV/40 mV/60 mV/80 mV. An eighth reference threshold value 30' having value 110 mV is characterized in the drawing to the right of second clock divider 18b by an arrow and a ground symbol (each without reference numeral).

A respective vertical arrow shown above first and second clock dividers 18a and 18b indicates variable 22 characterizing the nominal current of electrical consumer 12. Variable 22 is 30 mV in the present example and may be identical for both clock dividers 18a and 18b. See for comparison above-described reference threshold values 30' which are assigned in ascending order along arrows 38 and 40.

At an output of control circuit 37, the function of control circuit 37 is illustrated with the aid of dotted lines and arrows. Dotted lines 37a and 37b, which are shown horizontally beneath first and second clock dividers 18a and 18b, each characterize a "multiplexer function" or a "compensating sequential circuit". In addition, seven downwardly directed arrows (no reference numeral) are shown at outputs of first and second clock dividers 18a and 18b, which may each be "contacted" by a circle symbol displaceable horizontally along lines 37a and 37b.

In this way, a respective output of first clock divider 18a may be connected to the clock input (arrow 26) of up-down counter 14 for counting up. Accordingly, a respective output of second clock divider 18b may be connected to the clock input (arrow 28) of up-down counter 14 for counting down.

Respective binary values "1" and "0" shown above horizontal arrows 38 and 40 denote an activation, predefinable with the aid of configuration, of the respective outputs of first and second clock dividers 18a and 18b. Binary value "1" denotes an activation, i.e., the respective output transmitting a clock signal divided according to division factor 24 to up-down counter 14 when the output is contacted with the aid of the respective multiplexer function. Accordingly, binary value "0" denotes that no clock signal is transmitted to up-down counter 14.

In this way, a comparatively flexible configuration of clock dividers 18a and 18b is enabled. Counting up, counting down or a maintenance state of up-down counter 14 may be configured for each threshold value 30 or reference threshold value 30' or output of clock dividers 18a and 18b. A counting direction not desired for a particular output is blocked ("deactivated", binary value "0") per configuration, and a respective desired counting direction is enabled ("activated") with the aid of predefinable binary value "1".

If threshold value 30 is greater than variable 22 characterizing the nominal current, faster up-counting of up-down counter 14 corresponding to division factor 24 results with incrementally increasing threshold value 30. See for comparison first clock divider 18a, a "faster" division factor 24 being increasingly achieved in the direction of arrow 38.

If threshold value 30 is smaller than variable 22 characterizing the nominal current, faster down-counting of up-down counter 14 corresponding to division factor 24 results with incrementally decreasing threshold value 30. See for comparison second clock divider 18b, a "faster" division factor 24 being increasingly achieved counter to the direction of arrow 40.

Said activation or deactivation of the outputs of first and second clock dividers 18a and 18b, in cooperation with associated reference threshold values 30' and the multiplexer function ("compensating sequential circuit") is carried out, for example, according to the following rules:

(1) The contacting (circle symbol) of the outputs takes place at exactly identical reference threshold values 30' for first and second clock dividers 18a and 18b in the example of FIG. 1. In FIG. 1, the second output from the right of first clock divider 18a is contacted, corresponding to a reference threshold value 30' of 20 mV. Accordingly, the third output from the left of second clock divider 18b is contacted, corresponding to a reference threshold value 30' of also 20 mV.

(2) For a reference threshold value 30' characterizing the nominal current, 30 mV in the present example, the associated outputs of first and second clock dividers 18a and 18b are both deactivated, i.e., "0". In the case of the nominal current, up-down counter 14 does not count, but maintains its counter content.

(3) For all remaining reference threshold values 30', exactly one of the two clock inputs of up-down counter 14 denoted by arrows 26 and 28 is activated using a clock signal. If a threshold value 30 of greater than 30 mV is currently present, up-down counter 14 counts up. If a threshold value 30 of smaller than 30 mV is currently present, up-down counter 14 counts down.

It shall be understood that the embodiment of the described "multiplexer function" or "compensating sequential circuit" is shown only by way of example and may be implemented with the aid of a wide variety of elements (gates, multiplexer circuits, programmable dividers, high-impedance controlling of outputs and the like).

In one specific embodiment (not shown), circuit system 10 includes only first clock divider 18a, first clock divider 18a being configured to clock up-down counter 14, and up-down counter 14 including at least one control input for a counting direction of up-down counter 14, and up-down counter 14 being configured to count up or to count down, or to maintain a counter content, as a function of the at least one control input. This specific embodiment is functionally equivalent to the specific embodiment of FIG. 1 and makes it possible to simplify the circuit structure, if necessary. An activation of the above-described multiplexer function may possibly be slightly more complicated.

An operation of circuit system 10 of FIG. 1 takes place as follows, for example:

In a first state, it shall be assumed that the actual current of electrical consumer 12 corresponds to the nominal current, which is 2.5 amperes, for example. Variable 20 characterizing the actual current is 25 mV, for example. Logic 34 then operates as follows: threshold value 30 is incrementally increased using reference threshold values 30' along stages 10 mV, 15 mV, 20 mV, 30 mV, 40 mV, 60 mV, 80 mV, 110 mV, until threshold value 30 is greater than variable 20 characterizing the actual current, i.e., up to a value of 30 mV in the present example.

In a subsequent step, threshold value 30 is lowered by one stage using the same reference threshold values 30', i.e., to a value of 20 mV in the present example, since threshold value 30 is now greater than variable 20 characterizing the actual current. In a subsequent step, threshold value 30 is increased by one stage using the same reference threshold values 30', i.e., to a value of 30 mV again in the present example, since threshold value 30 is now smaller than variable 20 characterizing the actual current, and so forth.

At an approximately constant variable 20, i.e., at approximately 25 mV in the example, threshold value 30 thus continuously oscillates between two reference threshold values 30' of 20 mV and 30 mV. In one specific embodiment of logic 34, it is achieved by a predefinable delay in logic 34 that a frequency of said oscillation is in the same order of magnitude, for example, as a rate of change to be expected of the actual current. The frequency of the oscillation may be at least as large as the rate of change to be expected of the actual current.

In one specific embodiment, digital variable 36 is alternately characterized by threshold values 30 of 20 mV and 30 mV, depending on the oscillation. In one alternative specific embodiment, digital variable 36 is constantly characterized by lower threshold value 30 of 20 mV. In one alternative specific embodiment, digital variable 36 is constantly characterized by upper threshold value 30 of 30 mV.

Corresponding to digital variable 36, the contacting (circle symbol) of first and second clock dividers 18a and 18b may take place with the aid of the multiplexer function at outputs with threshold values 30 identical to one another, i.e., at 20 mV or 30 mV, or alternately 20 mV and 30 mV, in the example. Accordingly, a division factor 24 of 1/32 or 1/16, or alternately 1/32 and 1/16, results in the example for first clock divider 18a. Accordingly, a division factor 24 of 1/4 or 1/8, or alternately 1/4 and 1/8, results in the example for second clock divider 18b.

Corresponding to these division factors 24 and corresponding to predefined binary values "0" and "1" (see the symbols for clock dividers 18a and 18b), up-down counter 14 counts down comparatively slowly (20 mV), or up-down counter 14 maintains its instantaneous counter content (30 mV), or up-down counter 14 alternately counts down slowly and maintains its counter content (20 mV and 30 mV). In the present example, this results only with the aid of second clock divider 18b since first clock divider 18a is inactivated for both threshold values 30 of 20 mV and 30 mV in each case with the aid of binary value "0".

In one specific embodiment, the contacting (circle symbol) of first and second clock dividers 18a and 18b only takes place with the aid of the multiplexer function when the associated output of clock divider 18a and 18b is activated with a binary value "1". In this way, unnecessary selection processes at the respective clock divider 18a or 18b which are not required may be avoided, whereby the multiplexer function may be simplified, if necessary.

As is apparent from FIG. 1, variable 22 characterizing nominal current 22 is approximated by threshold value 30 or reference threshold value 30' of 30 mV in the present example. Both clock dividers 18a and 18b have binary value "0" so that up-down counter 14 is not clocked, and thus is able to maintain its instantaneous counter content. The outputs of first and second clock dividers 18a and 18b selected for this purpose are each characterized by arrow 22.

It shall be assumed in the present example that this instantaneous counter content is smaller than an overflow threshold of up-down counter 14. Accordingly, control signal 16 is inactive and, for example, has a value "zero". Electrical consumer 12 may be activated and operated in a normal manner with the aid of an activation signal 42.

It shall be understood that the wiring of electrical consumer 12 shown in FIG. 1 is shown only by way of example. For example, control signal 16 and activation signal 42 may be combined outside electrical consumer 12 with the aid of a logic circuit or the like, so that electrical consumer 12 or a semiconductor switch activating electrical consumer 12 is activated with the aid of the combined signal.

In a subsequent second state, it shall be assumed that the actual current of electrical consumer 12 is becoming smaller or is smaller, for example 1.8 amperes. Variable 20 characterizing the actual current is then 18 mV, for example. In a manner comparable to the above-described first state, this results in the following:

Threshold value 30 used in logic 34 oscillates between two reference threshold values 30' of 15 mV and 20 mV.

Digital variable 36 is accordingly characterized by a threshold value 30 of 15 mV or 20 mV, or alternately by threshold values 30 of 15 mV and 20 mV.

Division factor 24 of second clock divider 18b is 1/2 or 1/4, or alternately 1/2 and 1/4.

First clock divider 18a is inactive due to binary values "0" configured for threshold values 30 of 15 mV and 20 mV.

Up-down counter 14 continuously counts down, and in particular either slowly (division factor 24 equal to 1/4) or at an average speed (division factor 24 equal to 1/2), or alternately slowly and at an average speed.

Control signal 16 remains inactive.

As is apparent from the behavior of comparator 32 or logic 34 for the first and second states, threshold value 30 and accordingly digital variable 36 at least approximately follow a progression over time of variable 20 characterizing the actual current. Threshold value 30 so-to-speak "follows" the actual current of electrical consumer 12 or variable 20. Threshold value 30 in general oscillates between two adjoining reference threshold values 30' in the process.

In a subsequent third state, it shall be assumed that the actual current of electrical consumer 12 is becoming greater or is greater, and ultimately exceeds the assumed nominal current of 2.5 amperes.

Corresponding to the behavior of logic 34 described for the first and second states, and the multiplexer function effectuated by control circuit 37, clock dividers 18a and 18b and up-down counter 14, up-down counter 14 may now count up, a counting speed disproportionately, in particular at least approximately quadratically, increasing as threshold value 30 increases.

As soon as instantaneous counter content of up-down counter 14 is greater than the overflow threshold, control signal 16 becomes active, for example "one". In this way, electrical consumer 12 may be controlled, and in particular shut off, whereby possible thermal overloading of electrical consumer 12 or of the semiconductor switch activating electrical consumer 12 may be prevented.

In one specific embodiment, a thermal capacitance and possibly other, in particular thermal, variables characterizing electrical consumer 12 or the semiconductor switch, are characterized by appropriate parameters of circuit system 10. These parameters may, for example, encompass the properties of prescaler 29 and of clock dividers 18a and 18b, and a maximum counting range of up-down counter 14 and a predefinition of the overflow threshold.

Overall, circuit system 10 of FIG. 1 at least approximately enables a (thermal) monitoring of electrical consumer 12 according to the so-called "I²t principle". A square of the actual current ("I²") characterizes a power consumed by electrical consumer 12. Accordingly, the product of the square of the actual current with the time ("I²t") characterizes an energy consumed by electrical consumer 12, in particular lost energy. Up-down counter 14, in particular, enables an integral to be formed of said product "I²t".

In one particularly embodiment of circuit system 10, reference threshold values 30'—as described in FIG. 1—are continuously different from one another at least approximately by a respective factor of $\sqrt{2}$. Together with the property that division factor 24 is incrementally variable (along arrows 38 or 40) by a respective factor of 2, the above-described square of actual current "I²t" results "automatically" so-to-speak. In this way, circuit system 10 may advantageously be implemented using particularly simple digital switching elements.

In one further specific embodiment, circuit system 10, in particular logic 34, is configured to additionally monitor electrical consumer 12 and/or a semiconductor switch controlling electrical consumer 12 with respect to an excessively high actual current and, if necessary, to control, in particular shut off, electrical consumer 12. This may take place without a participation of up-down counter 14.

Figure 2:
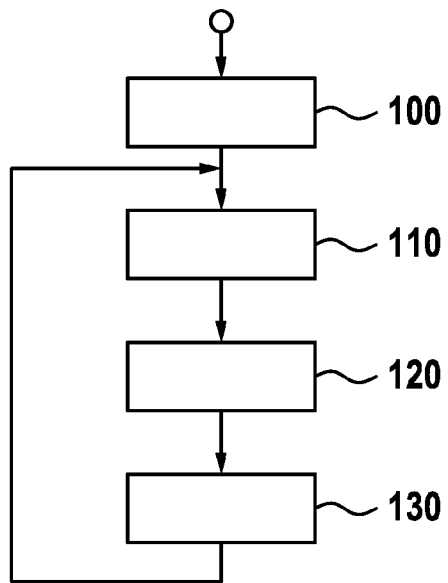
FIG. 2 shows a flow chart for a first method for operating the circuit system of FIG. 1.

In addition to FIG. 1, FIG. 2 shows a first flow chart for a method for operating circuit system 10 for controlling electrical consumer 12, circuit system 10 including an up-down counter 14, and circuit system 10 generating a control signal 16 for controlling electrical consumer 12, in particular for shutting electrical consumer 12 off, as a function of a counter content of up-down counter 14. Circuit system 10 includes a controllable clock divider circuit 18, with the aid of which circuit system 10 predefines a counting direction and a counting speed of up-down counter 14 as a function of at least one variable 20, 22 characterizing an actual current and/or a nominal current of electrical consumer 12.

In a first block 100, clock divider circuit 18 is configured corresponding to the nominal current of electrical consumer 12. This takes place, in particular, by predefining binary values "0" and "1" for the outputs of clock dividers 18a and 18b, as was already described above for FIG. 1. Moreover, (optional) prescaler 29 and the overflow threshold of up-down counter 14 may be configured.

In a second block 110, variable 20 characterizing the actual current is ascertained. In a subsequent block 120, the counting direction and the counting speed of up-down counter 14 are predefined as a function of variable 20.

In a subsequent block 130, control signal 16 for a possible shut-off of electrical consumer 12 is ascertained as a function of the overflow threshold of up-down counter 14. Thereafter, the method branches to an input of block 110 and is repeated cyclically.

In one specific embodiment, the method carried out in block 110 is characterized by at least one of the following steps:

Variable 20 characterizing the actual current of electrical consumer 12 is compared to threshold value 30, threshold value 30 being varied as a function of the comparison, and in particular also as a function of threshold value 30 itself.

Threshold value 30 is predefined with the aid of selection from a multitude of reference threshold values 30' of differing levels, a reference threshold value 30' which is greater in relation to an instantaneous reference threshold value 30' being selected when variable 20 characterizing the actual current of electrical consumer 12 is greater than threshold value 30, and a reference threshold value 30' which is smaller in relation to an instantaneous reference threshold value 30' being selected when variable 20 characterizing the actual current of electrical consumer 12 is smaller than threshold value 30.

In one specific embodiment, the method carried out in block 120 is characterized by at least one of the following steps:

first controllable clock divider 18a clocks up-down counter 14 for counting up;

second controllable clock divider 18b clocks up-down counter 14 for counting down;

circuit system 10 predefines a division factor 24 of first and/or second controllable clock divider(s) 18a and/or 18b as a function of the at least one variable 20, 22 characterizing the actual current and/or the nominal current of electrical consumer 12, in particular division factor 24 being incrementally variable by a respective factor of 2. With the aid of the above-described binary values, it is ensured that up-down counter 14 receives at most one clock signal from clock dividers 18a and 18b.

Figure 3:
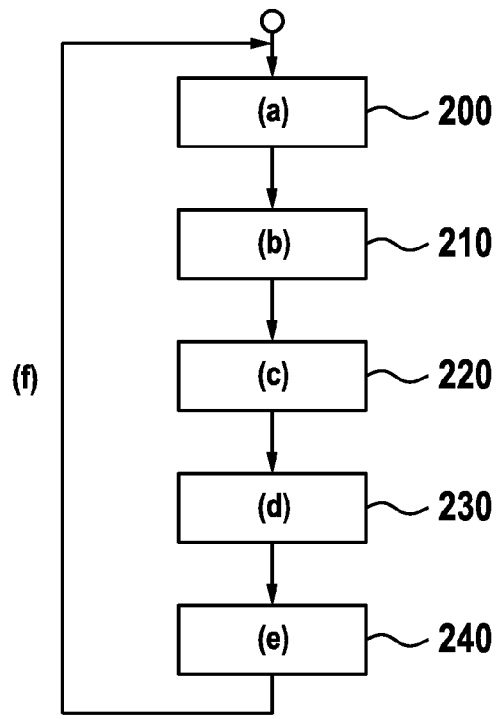
FIG. 3 shows a flow chart for a second method for operating the circuit system of FIG. 1.

FIG. 3 shows a further specific embodiment for a method for operating circuit system 10 of FIG. 1. The following steps are carried out cyclically:

(a) comparing variable 20 characterizing the actual current of electrical consumer 12 to threshold value (30); (block 200);

(b) selecting a reference threshold value 30' which is greater in relation to an instantaneous reference threshold value 30' if the comparison yields a first result; (block 210);

(c) selecting a reference threshold value 30' which is smaller in relation to an instantaneous reference threshold value 30' if the comparison yields a second result; the first and the second result may be characterized by a respective logic level of output signal 32a of comparator 32; (block 220);

(d) transmitting a digital variable 36 characterizing threshold value 30 to control circuit 37 controlling controllable clock divider circuit 18; (block 230);

(e) varying a counting direction and/or a counting speed of up-down counter 14 as a function of digital variable 36; (block 240); and (f) returning to step (a) or block 200 of the method.

If useful, the steps according to FIGS. 2 and 3 may optionally be combined.

What is claimed is:

1. A circuit apparatus for controlling an electrical consumer, comprising:
a circuit system, including:
an up-down counter, wherein the circuit system is configured to generate a control signal for controlling the electrical consumer, in particular for shutting off the electrical consumer, as a function of a counter content of the up-down counter; and
a controllable clock divider circuit, by which the circuit system is configured to predefine a counting direction and a counting speed of the up-down counter as a function of at least one variable characterizing an actual current and/or a nominal current of the electrical consumer, wherein the circuit system is configured to compare the variable characterizing the actual current of the electrical consumer to a threshold value and to vary the threshold value as a function of the comparison.

2. The circuit apparatus of claim 1, wherein the circuit system is configured to predefine at least one division factor of the controllable clock divider circuit as a function of the at least one variable characterizing the actual current and/or the nominal current of the electrical consumer.

3. The circuit apparatus of claim 2, wherein the division factor is incrementally variable by a respective factor of 2.

4. The circuit apparatus of claim 1, wherein the controllable clock divider circuit includes a first and a second controllable clock divider, and wherein the first controllable clock divider is configured to clock the up-down counter for counting up, and the second controllable clock divider is configured to clock the up-down counter for counting down.

5. The circuit apparatus of claim 1, wherein the circuit system is configured to predefine the threshold value with the aid of a selection from a multitude of reference threshold values of differing levels, and wherein the circuit system is configured to select a reference threshold value which is greater in relation to an instantaneous reference threshold value when the variable characterizing the actual current of the electrical consumer is greater than the threshold value, and to select a reference threshold value which is smaller in relation to an instantaneous reference threshold value when the variable characterizing the actual current of the electrical consumer is smaller than the threshold value.

6. The circuit apparatus of claim 5, wherein at least some reference threshold values of differing levels are continuously different from one another at least approximately by a respective factor of approximately $\sqrt{2}$.

7. The circuit apparatus of claim 5, wherein all reference threshold values of differing levels are continuously different from one another at least approximately by a respective factor of approximately $\sqrt{2}$.

8. The circuit apparatus of claim 1, wherein the circuit system is configured to predefine at least one division factor of the controllable clock divider circuit as a function of a digital variable characterizing the threshold value.

9. The circuit apparatus of claim 1, wherein the circuit system is configured to compare the variable characterizing the actual current of the electrical consumer to a threshold value and to vary the threshold value as a function of the comparison, in particular as a function of the threshold value.

10. A method for operating a circuit system for controlling an electrical consumer, the method comprising:
generating, via the circuit system, a control signal for controlling and/or shutting off the electrical consumer, as a function of a counter content of the up-down counter;
wherein the circuit system includes an up-down counter, and a controllable clock divider circuit, by which the circuit system predefines a counting direction and a counting speed of the up-down counter as a function of at least one variable characterizing an actual current and/or a nominal current of the electrical consumer.

11. The method of claim 10, wherein the controllable clock divider circuit includes a first and a second controllable clock divider, further comprising:
clocking, via the first controllable clock divider, the up-down counter for counting up; and
clocking, via the second controllable clock divider, the up-down counter for counting down;
wherein the circuit system predefines a division factor of the first and/or the second controllable clock divider(s) as a function of the at least one variable characterizing the actual current and/or the nominal current of the electrical consumer, wherein the variable characterizing the actual current of the electrical consumer is compared to a threshold value, the threshold value is varied as a function of the comparison.

12. The method of claim 11, wherein the threshold value is predefined with the aid of a selection from a multitude of reference threshold values of differing levels, a reference threshold value which is greater in relation to an instantaneous reference threshold value is selected when the variable characterizing the actual current of the electrical consumer is greater than the threshold value, and a reference threshold value which is smaller in relation to an instantaneous reference threshold value is selected when the variable characterizing the actual current of the electrical consumer is smaller than the threshold value.

13. The method of claim 12, wherein the following steps are carried out cyclically:

(a) comparing the variable characterizing the actual current of the electrical consumer to the threshold value;

(b) selecting a reference threshold value which is greater in relation to an instantaneous reference threshold value if the comparison yields a first result;

(c) selecting a reference threshold value which is smaller in relation to an instantaneous reference threshold value if the comparison yields a second result;

(d) transmitting a digital variable characterizing the threshold value to a control circuit controlling the controllable clock divider circuit;

(e) varying a counting direction and/or a counting speed of the up-down counteras a function of the digital variable; and (f) returning to step (a) of the method.

14. The method of claim 10, wherein the controllable clock divider circuit includes a first and a second controllable clock divider, further comprising:

clocking, via the first controllable clock divider, the up-down counter for counting up; and clocking, via the second controllable clock divider, the up-down counter for counting down;

wherein the circuit system predefines a division factor of the first and/or the second controllable clock divider(s) as a function of the at least one variable characterizing the actual current and/or the nominal current of the electrical consumer, in particular the division factor is incrementally variable by a respective factor of 2.

15. The method of claim 10, wherein the variable characterizing the actual current of the electrical consumer is compared to a threshold value, the threshold value is varied as a function of the comparison, in particular as a function of the threshold value.

* * * * *